(12) United States Patent
Chen et al.

(10) Patent No.: US 11,490,532 B2
(45) Date of Patent: Nov. 1, 2022

(54) HINGE ASSEMBLIES

(71) Applicant: Hewlett-Packard Development Company, L.P., Spring, TX (US)

(72) Inventors: Wei-Chung Chen, Taipei (TW); Kuan-Ting Wu, Taipei (TW); Chi-Hao Chang, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 288 days.

(21) Appl. No.: 16/646,225

(22) PCT Filed: Oct. 6, 2017

(86) PCT No.: PCT/US2017/055587
§ 371 (c)(1),
(2) Date: Mar. 11, 2020

(87) PCT Pub. No.: WO2019/070293
PCT Pub. Date: Apr. 11, 2019

(65) Prior Publication Data
US 2020/0281084 A1    Sep. 3, 2020

(51) Int. Cl.
*H05K 5/00* (2006.01)
*H05K 5/02* (2006.01)
*E05D 11/10* (2006.01)
*G06F 1/16* (2006.01)

(52) U.S. Cl.
CPC ......... *H05K 5/0226* (2013.01); *E05D 11/105* (2013.01); *E05Y 2201/484* (2013.01); *E05Y 2900/606* (2013.01); *G06F 1/1681* (2013.01)

(58) Field of Classification Search
None
See application file for complete search history.

(56) References Cited

U.S. PATENT DOCUMENTS 9,021,657 B2 * 5/2015 Park ................. G06F 1/1616
                                                    16/354
9,173,288 B1 * 10/2015 Kim ................. G06F 1/1681
9,348,450 B1 * 5/2016 Kim ................. G06F 1/1616
(Continued)

FOREIGN PATENT DOCUMENTS

CN         1610870 C      4/2005
CN      101666194 A       3/2010
(Continued)

*Primary Examiner* — Anthony Q Edwards
*Assistant Examiner* — Rashen E Morrison
(74) *Attorney, Agent, or Firm* — Lakshmi Kumaran & Sridharan (57) ABSTRACT

Examples of hinge assemblies are described. In an example implementation, a hinge assembly includes hinge elements which are interconnected to move the hinge assembly between a folded position and an unfolded position. The hinge assembly further includes elastic members disposed between the hinge elements at a first side and a second side thereof. When the hinge assembly is moved from the unfolded position towards the folded position, elastic members at the first side are decompressed and elastic members at the second side are stretched. When the hinge assembly is moved from the folded position towards the unfolded position, elastic members at the first side are compressed and the elastic members at the second side are destretched.

16 Claims, 8 Drawing Sheets

(56) References Cited

U.S. PATENT DOCUMENTS

| | | | |
|---|---|---|---|
| 9,535,452 B2* | 1/2017 | Ahn | G06F 1/1615 |
| 9,572,272 B2* | 2/2017 | Lee | H05K 5/0021 |
| 9,733,668 B2* | 8/2017 | Park | H04B 1/385 |
| 9,801,290 B2* | 10/2017 | Ahn | H05K 5/0226 |
| 10,063,677 B2* | 8/2018 | Cavallaro | G06F 1/1652 |
| 10,082,827 B2* | 9/2018 | Yamauchi | G06F 1/1652 |
| 10,143,098 B1* | 11/2018 | Lee | G06F 3/041 |
| 10,274,997 B2* | 4/2019 | Lin | G06F 1/1616 |
| 10,306,788 B2* | 5/2019 | Bi | G06F 1/1681 |
| 10,364,598 B2* | 7/2019 | Tazbaz | E05D 11/1064 |
| 10,416,710 B2* | 9/2019 | Mizoguchi | G06F 1/1641 |
| 10,481,634 B2* | 11/2019 | Mizoguchi | G06F 1/1616 |
| 10,564,682 B1* | 2/2020 | Wu | H05K 5/0226 |
| 10,705,563 B2* | 7/2020 | Lin | H04M 1/02 |
| 10,716,228 B2* | 7/2020 | You | F16M 11/04 |
| 2011/0043976 A1* | 2/2011 | Visser | G09F 9/301 |
| | | | 361/679.01 |
| 2011/0063783 A1* | 3/2011 | Shim | G06F 1/1615 |
| | | | 361/679.01 |
| 2012/0120618 A1* | 5/2012 | Bohn | G06F 1/1618 |
| | | | 361/679.01 |
| 2013/0021762 A1* | 1/2013 | van Dijk | G06F 1/1681 |
| | | | 361/749 |
| 2015/0089974 A1* | 4/2015 | Seo | A44C 5/0076 |
| | | | 63/1.13 |
| 2016/0139634 A1 | 5/2016 | Cho et al. | |
| 2017/0060188 A1* | 3/2017 | Han | G06F 1/1641 |
| 2017/0061836 A1* | 3/2017 | Kim | G06F 1/1626 |
| 2018/0275725 A1* | 9/2018 | Lin | G06F 1/1616 |

FOREIGN PATENT DOCUMENTS

| | | |
|---|---|---|
| CN | 101737417 B | 6/2010 |
| CN | 103228114 A | 7/2013 |
| CN | 103266820 A | 8/2013 |
| KR | 101604826 B1 | 3/2016 |
| WO | WO-2015093801 A1 | 6/2015 |

* cited by examiner

HINGE ASSEMBLIES

BACKGROUND

Electronic devices may be manufactured to be compact and portable. Electronic devices may have support structures, such as hinge assemblies or joints that allow a component of the electronic device, such as a display unit, to fold over another component of the electronic device, such as a base unit.

BRIEF DESCRIPTION OF THE DRAWINGS

The following detailed description references the drawings, wherein.

DETAILED DESCRIPTION

Electronic devices, such as laptops, smartphones, personal digital assistants (PDAs), or the like, have several foldable components. An electronic device may have a display unit for rendering visual content and a base unit to hold a keyboard, memory, and other electronic circuitry. The display unit may be coupled to the base unit through a hinge assembly.

The hinge assembly may be folded and unfolded which enables the display unit to move with respect to the base unit. The hinge assembly generally used in the electronic devices has interconnected movable segments which allow folding and unfolding of the hinge assembly. Each of the movable segments bear a flange and a groove adapted to receive the flange of an adjacent movable segment. During folding and unfolding, the flange of one segment moves within the groove of an adjacent segment thereby providing an interference fit between the two. However, movement of the flange in the groove may cause wear and tear of the flange and inner walls of the groove interfacing the flange. This may result in a loose fit between the flange and the groove thereby reducing stability of the hinge assembly. The hinge assembly with a reduced stability may not be able to retain the display unit at a particular folded position. Wear and tear of the flange and groove may also adversely affect the durability of the hinge assembly.

In accordance with an example implementation of the present subject matter, a hinge assembly having interconnected hinge elements and elastic members, disposed on either side of the hinge elements is described. The elastic members get characteristically compressed/decompressed and stretched/destretched depending on a direction of movement of the hinge assembly. These elastic members provide stability and durability to the hinge assembly.

In an example implementation, the hinge assembly includes a first hinge element and a second hinge element interconnected with the first hinge element to move the hinge assembly between a folded position and an unfolded position. In an example implementation, when the hinge assembly couples one component of an electronic device with another component of the electronic device, the folded position refers to a condition of the hinge assembly when the angle is 0 degrees, between the two components that are coupled. In an example implementation, at the folded position, the angle between the two components coupled by the hinge assembly may be more than 0 degree. In the example implementation, the unfolded position refers to a condition of the hinge assembly when the angle is 180 degrees, between the two components which are coupled. In an example implementation, at the unfolded position, the angle between the two components coupled by the hinge assembly may be less than 180 degrees or more than 180 degrees.

The hinge assembly further includes a first elastic member disposed between the first hinge element and the second hinge element at a first side thereof, and a second elastic member disposed between the first hinge element and the second hinge element at a second side thereof. In an example implementation, the first elastic member is a compressible element. Under an unbiased/unloaded condition, in absence of any tensile or compressive external forces, the first elastic member remains at a decompressed neutral state. When compressive forces are exerted on the first elastic member, it gets elastically compressed from the decompressed neutral state towards a fully biased compressed state. The fully biased compressed state refers to a fully loaded condition of the first elastic member when external compressive forces are acting on the first elastic member. In an example implementation, the second elastic member is a stretchable element. Under an unbiased/unloaded condition, in absence of any tensile or compressive external forces, the second elastic member remains at a destretched neutral state. When tensile forces are exerted on the second elastic member, it gets elastically stretched from the destretched neutral state towards a fully biased stretched state. The fully biased stretched state refers to a fully loaded condition of the second elastic member when external tensile forces are acting on the second elastic member.

In an example implementation, when the hinge assembly is moved from the unfolded position towards the folded position, the first elastic member gets decompressed and the second elastic member gets stretched. The decompression of the first elastic member refers to expansion of the first elastic member towards the decompressed neutral state. The stretching of the second elastic member refers to expansion of the second elastic member towards the fully biased stretched state.

In another example implementation, when the hinge assembly is moved from the folded position towards the unfolded position the first elastic member gets compressed and the second elastic member gets destretched. The compression of the first elastic member refers to contraction of the first elastic member towards the fully biased compressed state. The destretching of the second elastic member refers to contraction of the second elastic member towards the destretched neutral state.

Thus, during folding of the hinge assembly, the first elastic member decompresses towards its neutral/rest state and the second elastic member stretches towards its fully biased state and during unfolding the first elastic member compresses towards its fully biased state and the second elastic member destretches towards its neutral/rest state. These elastic members characteristically getting compressed/decompressed and stretched/destretched depending on the direction of movement of the hinge assembly produce counteracting forces on the hinge elements. The counteracting forces has an interlocking action to balance the movement of the hinge elements during folding and unfolding of the hinge assembly. This interlocking action provides greater stability to the hinge elements during folding and unfolding. The hinge elements having greater stability may be able to retain the display unit at a particular folded position. Further, the elastic members may also provide additional durability to the hinge assembly by reducing the frictional forces acting on the interfacing grooves and flanges of the hinge elements.

In an example implementation, a hinge assembly may include more than two hinge elements with a first set of elastic members on one side and a second set of elastic members on the other side. Each pair of adjacent hinge elements include the features and configuration similar to the first and second hinge elements described above. Each of the first set of elastic members are similar to the first elastic element and each of the second set of elastic members are similar to the second elastic element.

The above described implementations are further elaborated with reference to the Figures. It should be noted that the description and figures merely illustrate the principles of the present subject matter along with examples described herein and, should not be construed as a limitation to the present subject matter. It is thus noted that various arrangements may be devised that, although not explicitly described or shown herein, describe the principles of the present subject matter. Moreover, all statements herein reciting principles, aspects, and examples of the present subject matter, as well as specific examples thereof, are intended to encompass equivalents thereof.

Figure 1:
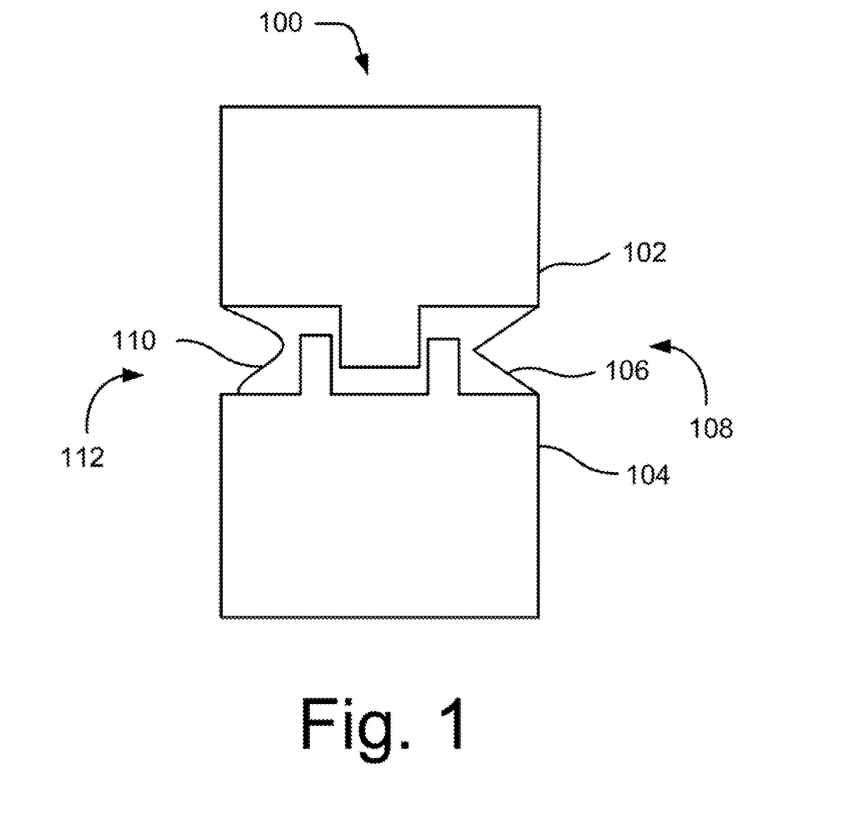
FIG. 1 illustrates a schematic representation of a hinge assembly, in accordance with an example implementation of the present subject matter.

FIG. 1 illustrates a schematic representation of a hinge assembly 100 in accordance with an example implementation of the present subject matter. In an example implementation, the hinge assembly 100 may be used in an electronic device, such as a laptop, a foldable smartphone, a foldable tablet, a Personal Digital Assistant (PDA), a foldable e-reader, or the like. The hinge assembly 100 may be used to couple two components of the electronic device. For example, the hinge assembly 100 may be used to couple a display unit of the electronic device to a base unit of the electronic device.

The hinge assembly 100 includes a first hinge element 102 and a second hinge element 104 interconnected with the first hinge element 102 to move the hinge assembly 100 between a folded position and an unfolded position. In an example implementation, the first hinge element 102 may be attached to a display unit of an electronic device and the second hinge element 104 may be attached to a base unit of the electronic device. The folded position of the hinge assembly 100 refers to a configuration of the hinge assembly 100 when the angle is 0 degrees between the two components coupled by the hinge assembly 100. The unfolded position of the hinge assembly 100 refers to a configuration of the hinge assembly when the angle is 180 degrees, between the two components coupled by the hinge assembly 100.

The hinge assembly 100 further includes a first elastic member 106 disposed between the first hinge element 102 and the second hinge element 104. The first elastic member 106 is disposed at a first side 108 of the first hinge element 102 and the second hinge element 104. In an example implementation, the first elastic member 106 may be a torsion spring.

In an example implementation, the first elastic member 106 is a compressible element. Under an unbiased/unloaded condition, in absence of any tensile or compressive external forces, the first elastic member 106 remains at a decompressed neutral state. When compressive forces are exerted on the first elastic member 106, it gets elastically compressed from the decompressed neutral state towards a fully biased compressed state. The fully biased compressed state refers to a fully loaded condition of the first elastic member 106 when external compressive forces are acting on the first elastic member.

The hinge assembly 100 further includes a second elastic member 110 disposed between the first hinge element 102 and the second hinge element 104. The second elastic member 110 is disposed at a second side 112 of the first hinge element 102 and the second hinge element 104. The second side 112 is opposite to the first side 108. In an example implementation, the second elastic member 110 may be a torsion spring.

In an example implementation, the second elastic member 108 is a stretchable element. Under an unbiased/unloaded condition, in absence of any tensile or compressive external forces, the second elastic member 108 remains at a destretched neutral state. When tensile forces are exerted on the second elastic member 108, it gets elastically stretched from the destretched neutral state towards a fully biased stretched state. The fully biased stretched state refers to a fully loaded condition of the second elastic member 108 when external tensile forces are acting on the second elastic member 108.

When the hinge assembly 100 is moved from the unfolded position towards the folded position, the first elastic member 106 is decompressed and the second elastic member 110 is stretched; and when the hinge assembly 100 is moved from the folded position towards the unfolded position, the first elastic member 106 is compressed and the second elastic member 110 is destretched. The compression/decompression of the first elastic member 106 and the stretching/destretching of the second elastic member 110 depending on the direction of movement of the hinge assembly 100 has a force balancing effect on the first and second hinge elements 102 and 104. Thus, the movement of the first and second hinge elements 102 and 104 during folding and unfolding is more stable.

Figure 2A:
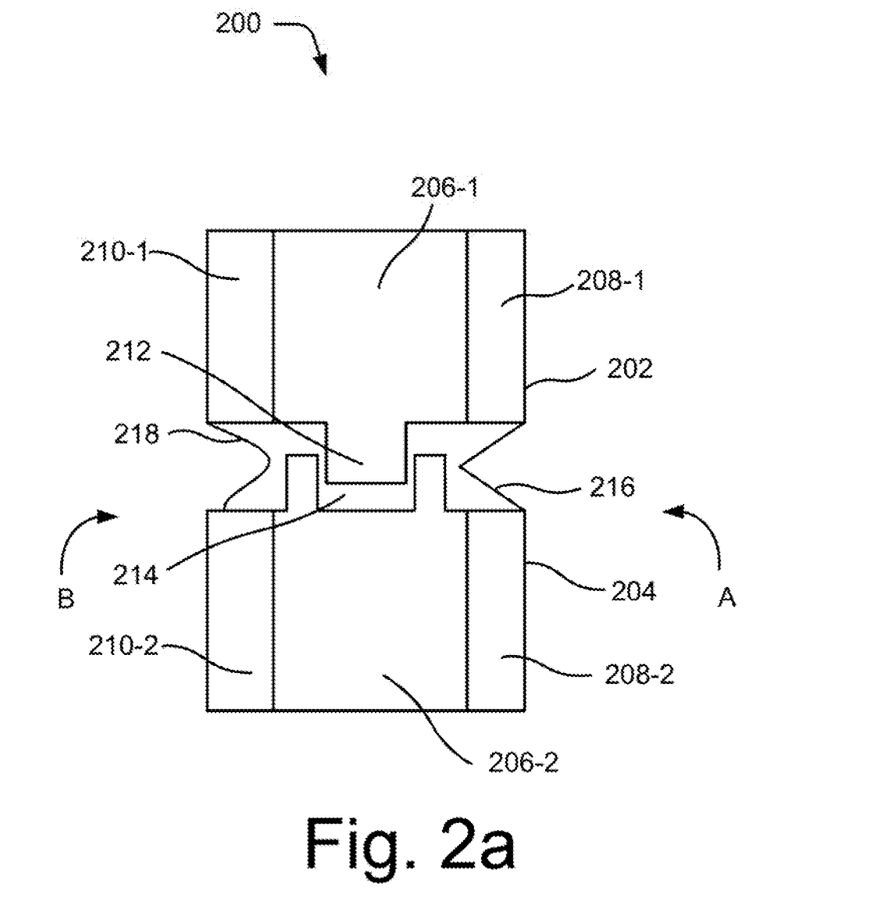
FIG. 2a illustrates a schematic representation of a hinge assembly, in accordance with another example implementation of the present subject matter.

FIG. 2a illustrates a schematic representation of a hinge assembly 200, in accordance with another example implementation of the present subject matter. The hinge assembly 200 includes a first hinge element 202 similar to the first hinge element 102 and a second hinge element 204 similar to the second hinge element 104.

The first hinge element 202 includes a central member 206-1 and a first side segment 208-1 mounted on the central member 206-1 at a first side of the first and second hinge elements 202 and 204. The first side is depicted by arrow A. The first hinge element 202 further includes a second side segment 210-1 mounted on the central member 206-1 at a second side of the first and second hinge elements 202 and 204. The second side is depicted by arrow B.

Similarly, the second hinge element 204 includes a central member 206-2 and a first side segment 208-2 mounted on the central member 206-2 at the first side, as depicted by arrow A. The second hinge element 204 further includes a second side segment 210-2 mounted on the central member 206-2 at the second side, as depicted by arrow B.

The central member 206-1 has a flange element 212 which can move into a groove 214 of the central member 206-2 forming an interference fit therebetween. Thus, interconnection of the first and second hinge elements 202 and 204 through the flange-groove fit enable movement of the hinge assembly 200 between a folded position and an unfolded position.

The hinge assembly 200 includes a first elastic member 216 disposed between the first side segment 208-1 of the first hinge element 202 and the first side segment 208-2 of the second hinge element 204. The hinge assembly 200 also includes a second elastic member 218 disposed between the second side segment 210-1 of the first hinge element 202 and the second side segment 210-2 of the second hinge element 204. In an example implementation, the first elastic member 216 is similar to the first elastic member 106 illustrated in FIG. 1 and the second elastic member 218 is similar to the second elastic member 110 illustrated in FIG. 1. The first side segments 208-1 and 208-2 and the second side segments 210-1 and 210-2 are illustrated in greater details through FIGS. 2b and 2c.

Figure 2B:
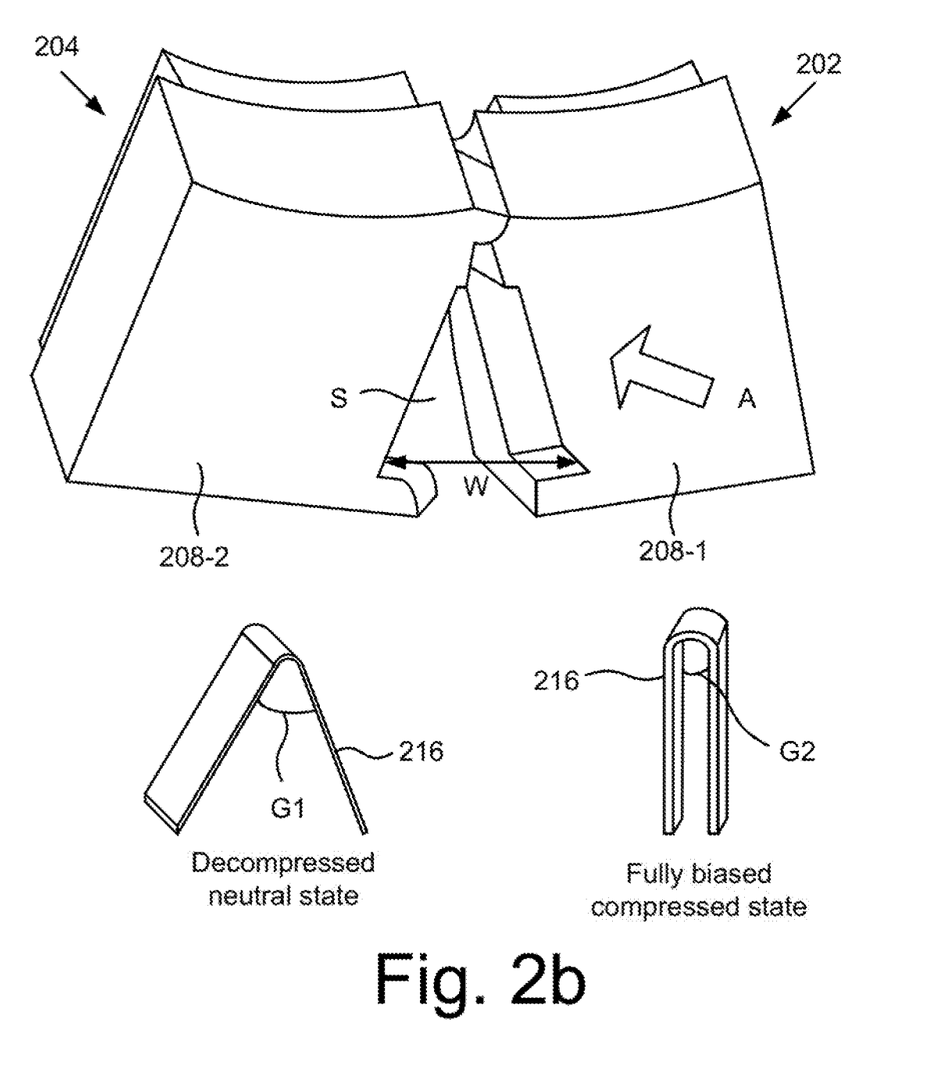
FIG. 2b illustrates a perspective view of the hinge assembly of FIG. 2a from a first side, in accordance with an example implementation of the present subject matter.

FIG. 2b illustrates a perspective view of the hinge assembly 200 from the first side, in accordance with an example implementation of the present subject matter. As shown in FIG. 2b, the hinge assembly 200 comprises a slot S formed between the first side segment 208-1 of the first hinge element 202 and the first side segment 208-2 of the second hinge element 204. The slot S has a width 'W' which reduces when the hinge assembly 200 is moved from the folded position towards the unfolded position and increases when the hinge assembly 200 is moved from the unfolded position towards the folded position.

FIG. 2b also depicts the first elastic member 216 that can be fitted into the slot S. In an example implementation, the first elastic member 216 is snug fitted within the slot S in such a manner that the walls of the slot S interface with the first elastic member 216. In a decompressed neutral state when no external forces are exerted on the first elastic member 216, the first elastic member 216 has a loading angle G1, as shown in FIG. 2b. In an example implementation, when compressive forces act on the first elastic member 216, the first elastic member 216 gets gradually biased and elastically compresses. At a fully biased compressed state, the first elastic member 216 has a loading angle G2, as shown in FIG. 2b. In an example implementation, G2 is smaller than G1. When the hinge assembly 200 is at the unfolded position, the first elastic member 216 is at the fully biased compressed state and when the hinge assembly is at the folded position, the first elastic member 216 is at the decompressed neutral state.

Figure 2C:
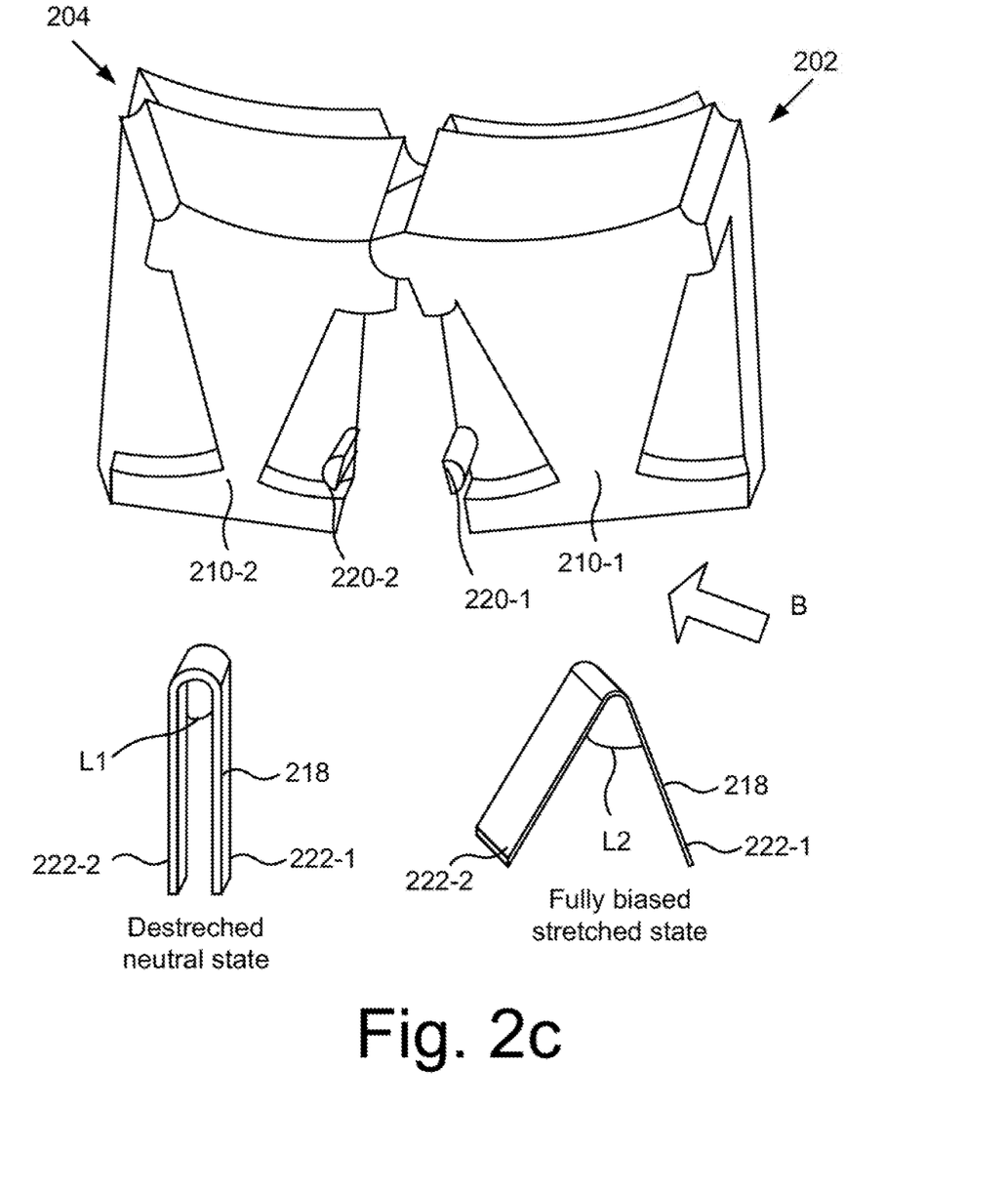
FIG. 2c illustrates a perspective view of the hinge assembly of FIG. 2a from a second side, in accordance with an example implementation of the present subject matter.

FIG. 2c illustrates a perspective view of the hinge assembly 200 from the second side, in accordance with an example implementation of the present subject matter. As show in FIG. 2c, the hinge assembly 200 includes a first strut 220-1 formed on the second side segment 210-1 of the first hinge element 202 and a second strut 220-2 formed on the second side segment 210-2 of the second hinge element 204. In an example implementation, the first strut 220-1 and the second strut 220-2 are projections of the second side segments 210-1 and 210-2, respectively, and extend in a direction away from the central members.

FIG. 2c also depicts the second elastic member 218 which can be fitted between the second side segments 210-1 and 210-2. In an example implementation, an end 222-1 of the second elastic member 218 may be attached to the first strut 220-1 and other end 222-2 of the second elastic member 218 may be attached to the second strut 220-2. In an example implementation, the ends 222-1 and 222-2 of the second elastic member 218 may be attached to the first and struts 220-1 and 220-2, respectively, through screws. In another example implementation, the end 222-1 may be glued to the first strut 220-1 and the end 222-2 may be glued to the second strut 220-2. In an example implementation, the ends 222-1 and 222-2 may be attached to the first and second struts 220-1 and 220-1, respectively, by other mechanical coupling means.

In a destretched neutral state when no external forces are exerted on the second elastic member 218, the second elastic member 218 has a loading angle L1, as shown in FIG. 2c. In an example implementation, when tensile forces act on the second elastic member 218, the second elastic member 218 gets gradually biased and elastically stretches. At a fully biased stretched state, the second elastic member 218 has a loading angle L2, as shown in FIG. 2c. In an example implementation, L2 is greater than L1.

When the hinge assembly 200 is moved from the unfolded position towards the folded position, the first strut 220-1 moves away from the second strut 220-2, thereby exerting tensile forces on the second elastic member 218, which gets gradually stretched. When the hinge assembly 200 is at the folded position, the second elastic member 218 is at the fully biased stretched state.

When the hinge assembly 200 is moved from the folded position towards the unfolded position, the first strut 220-1 moves towards the second strut 220-2, thereby gradually reducing the tensile forces on the second elastic member 218 which gets gradually destretched. When the hinge assembly 200 is at the unfolded position, the second elastic member 218 is at the destretched neutral state.

Figure 3A:
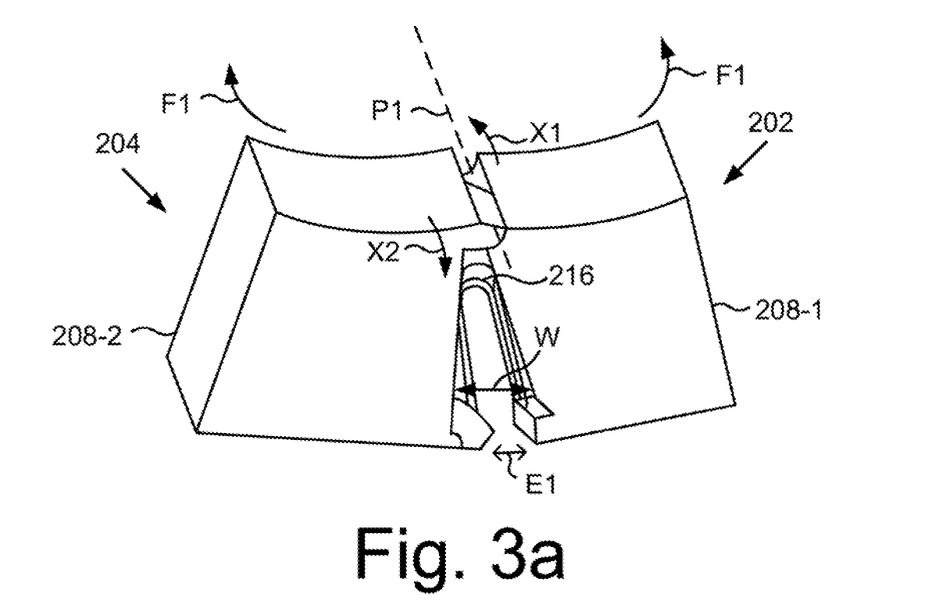
FIG. 3a illustrates a perspective view of first side segments of the hinge assembly of FIG. 2a, when the hinge assembly is moved from the unfolded position towards the folded position, in accordance with an example implementation of the present subject matter.

The operation of the hinge assembly 200, is illustrated through FIGS. 3a to 3d. FIG. 3a illustrates a perspective view of first side segments 208-1 and 208-2 of the hinge assembly 200, when the hinge assembly 200 is moved from the unfolded position towards the folded position, in accordance with an example implementation of the present subject matter.

Figure 3B:
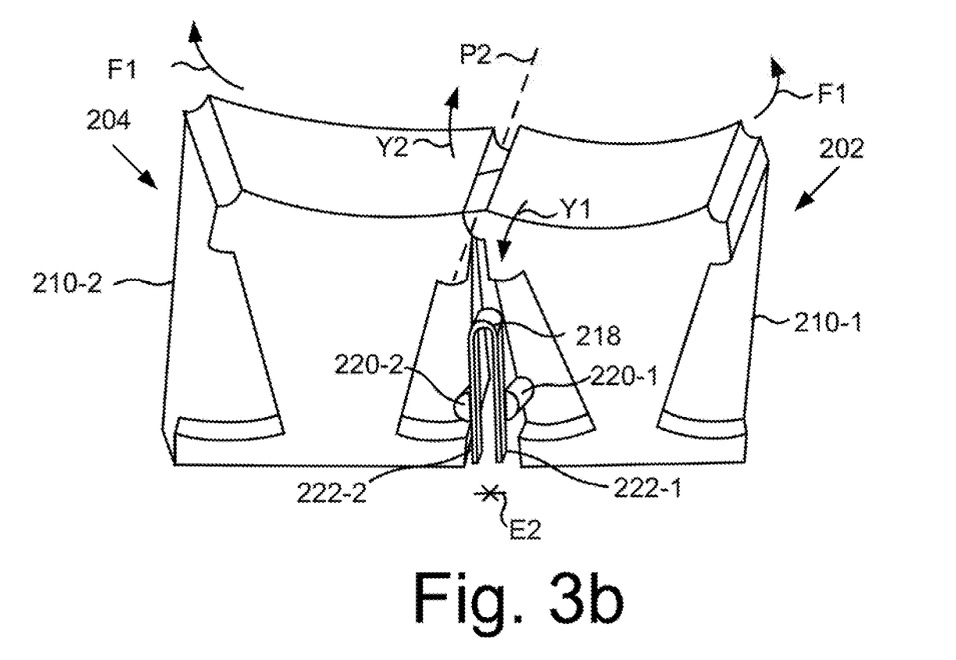
FIG. 3b illustrates a perspective view of second side segments of the hinge assembly of FIG. 2a, when the hinge assembly is moved from the unfolded position towards the folded position, in accordance with an example implementation of the present subject matter.

As shown in FIG. 3a, at the unfolded position of the hinge assembly 200, the first elastic member 216 is at a fully biased compressed state. When the hinge assembly 200 is moved from the unfolded position towards the folded position, forces are exerted on the first side segments 208-1 and 208-2 in a direction as indicated by arrows F1. Due to the forces in the direction indicated by arrows F1, the first side segment 208-1 of the first hinge element 202 rotates about an axis P1 and moves in a direction as indicated by the arrow X1. Likewise, the first side segment 208-2 of the second hinge element 204 rotates about the axis P1 and moves in a direction as indicated by the arrow X2. Due to movement of the first side segment 208-1 and the second side segment 208-2 away from each other, as indicated by the arrows X1 and X2, the width W of the slot increases. Since, the width W increases, the first elastic member 216 gradually decompresses towards its decompressed neutral state due to the elastic forces, depicted by the arrow E1, exerted by the first elastic member 216. In an example implementation, the elastic forces exerted by the first elastic member 216 depends on the elasticity constant of the material of the first elastic member 216. FIG. 3b illustrates the second side segments 210-1 and 210-2 when the hinge assembly 200 is moved from the unfolded position towards the folded position, in accordance with an example implementation of the present subject matter.

With reference to FIG. 3b, at the unfolded position of the hinge assembly 200, the second elastic member 218 is at a destretched neutral state. When the hinge assembly 200 is moved from the unfolded position towards the folded position, forces are exerted on the second side segments 210-1 and 210-2 in a direction as indicated by arrows F1. Due to the forces in the direction indicated by the arrows F1, the second side segment 210-1 of the first hinge element 202 rotates about an axis P2 and moves in a direction as indicated by arrow Y1. Likewise, the second side segment 210-2 of the second hinge element 204 rotates about the axis P2 and moves in a direction as indicated by arrow Y2. Due to movement of the second side segment 210-1 and the second side segment 210-2 away from each other, as indicated by arrows Y1 and Y2, the struts 220-1 and 220-2 move away from each other. Since, the struts 220-1 and 220-2 move away from each other, the ends 222-1 and 222-2 of the second elastic member 218 attached to the struts 220 also move away from each other thereby stretching the second elastic member 218.

The stretching of the second elastic member 218 biases the second elastic member 218 and thereby causes a deformation in shape of the second elastic member 218. As the second elastic member 218 gets stretched and gradually biased, the second elastic member 218 has a natural tendency to return back to its destretched neutral state and thereby exerts elastic forces in the direction as depicted by arrow E2, on the struts 220-1 and 220-2. In an example implementation, the elastic forces exerted by the second elastic member 218 depends on the elasticity constant of the material of the second elastic member 218.

As may be appreciated from the FIGS. 3a and 3b, when the hinge assembly 200 is moved from the unfolded position towards the folded position, the elastic forces, indicated by arrow E1, exerted by the first elastic member 216 are opposed by the elastic forces, indicated by arrow E2, exerted by the second elastic member 218. During folding, as the hinge assembly 200 reaches a desired position between the unfolded position and the folded position, the external forces, indicated by arrows F1 cease to exist and the elastic forces, indicated by arrows E1 and E2 counterbalance each other thereby enabling the hinge assembly 200 to be retained at the desired position.

Figure 3C:
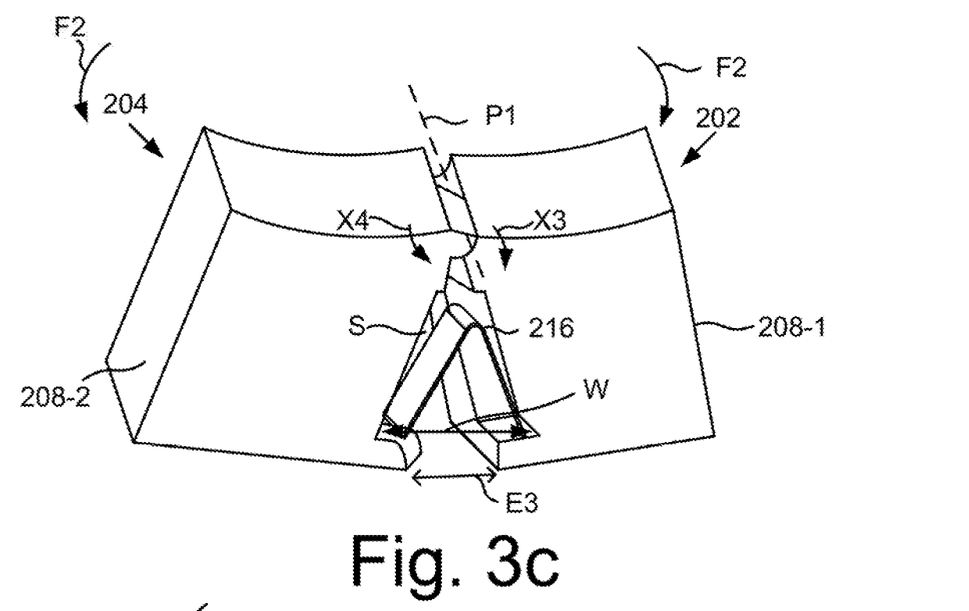
FIG. 3c illustrates a perspective view of the first side segments of the hinge assembly of FIG. 2a, when the hinge assembly is moved from the folded position towards the unfolded position, in accordance with an example implementation of the present subject matter.

When the hinge assembly 200 reaches the folded position, the first elastic member 216 is at a decompressed neutral state, as shown in the illustration of FIG. 3c. At the decompressed neutral state no external forces act on the first elastic member 216 and the first elastic member 216 is unbiased.

When the hinge assembly 200 is moved from the folded position towards the unfolded position, forces are exerted on the first side segments 208-1 and 208-2 in a direction as indicated by arrows F2. Due to the forces in the direction indicated by arrows F2, the first side segment 208-1 of the first hinge element 202 rotates about the axis P1 and moves in a direction as indicated by arrow X3. Likewise, the first side segment 208-2 of the second hinge element 204 rotates about the axis P1 and moves in a direction as indicated by arrow X4. Due to movement of the first side segment 208-1 and the second side segment 208-2 towards each other, as indicated by the arrows X3 and X4, the width W of the slot S decreases. Since, the width W decreases, the first elastic member 216 gets compressed.

The compression of the first elastic member 216 biases the first elastic member 216 and thereby causes a deformation in shape of the first elastic member 216. As the first elastic member 216 gets compressed and gradually biased, the first elastic member 216 has a natural tendency to return back to its decompressed neutral state and thereby exerts elastic forces, in the direction as indicated by arrow E3, on walls of the slot S.

Figure 3D:
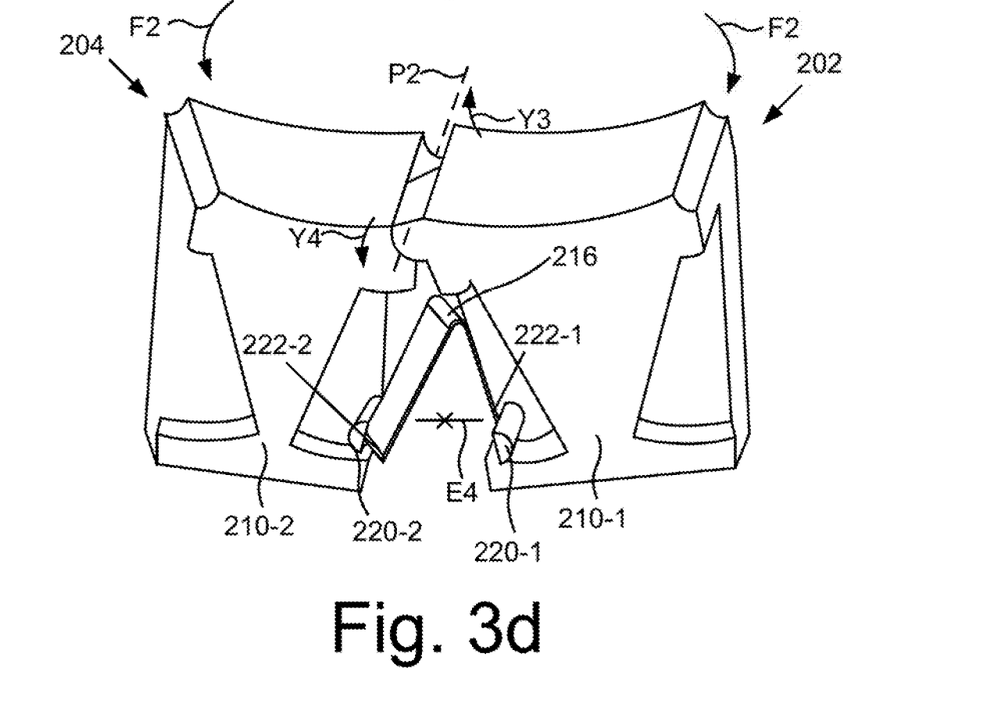
FIG. 3d illustrates a perspective view of the second side segments of the hinge assembly of FIG. 2a, when the hinge assembly is moved from the folded position towards the unfolded position, in accordance with an example implementation of the present subject matter.

With reference to FIG. 3d, at the folded position of the hinge assembly 200, the second elastic member 216 is at a fully biased stretched state. At the fully biased stretched state, the natural tendency of the second elastic member 218 is to return back to its rest state or the destretched neutral state. Hence elastic forces are exerted by the second elastic member 218, in the direction as indicated by arrow E4, on the first and second struts 220-1 and 220-2.

When the hinge assembly 200 is moved from the folded position towards the unfolded position, forces are exerted on the second side segments 210-1 and 210-2 in a direction as indicated by arrows F2. Due to the forces in the direction indicated by arrows F2, the second side segment 210-1 of the first hinge element 202 rotates about the axis P2, and moves in a direction as depicted by the arrow Y3. Likewise, the second side segment 210-2 of the second hinge element 204 rotates about the axis P2 and moves in a direction as depicted by arrow Y4. Due to movement of the second side segment 210-1 and the second side segment 210-2 towards each other, as depicted by the arrows Y3 and Y4, the struts 220-1 and 220-2 move towards each other. As the struts 220-1 and 220-2 move towards each other, the elastic forces indicated by arrows E4 brings the ends 222-1 and 222-2 of the second elastic member 218 towards each other, thereby destretching the second elastic member 218 towards its destretched neutral state.

As may be appreciated from the FIGS. 3c and 3d, when the hinge assembly 200 is moved from the folded position towards the unfolded position, the elastic forces, indicated by arrow E3, exerted by the first elastic member 216 are opposed by the elastic forces, indicated by arrow E4, exerted by the second elastic member 218. During unfolding, as the hinge assembly 200 reaches a desired position between the folded position and the unfolded position, the external forces, denoted by arrows F2 cease to exist and the elastic forces indicated by arrows E3 and E4 counterbalance each other thereby enabling the hinge assembly 200 to be retained at the desired position.

Figure 4:
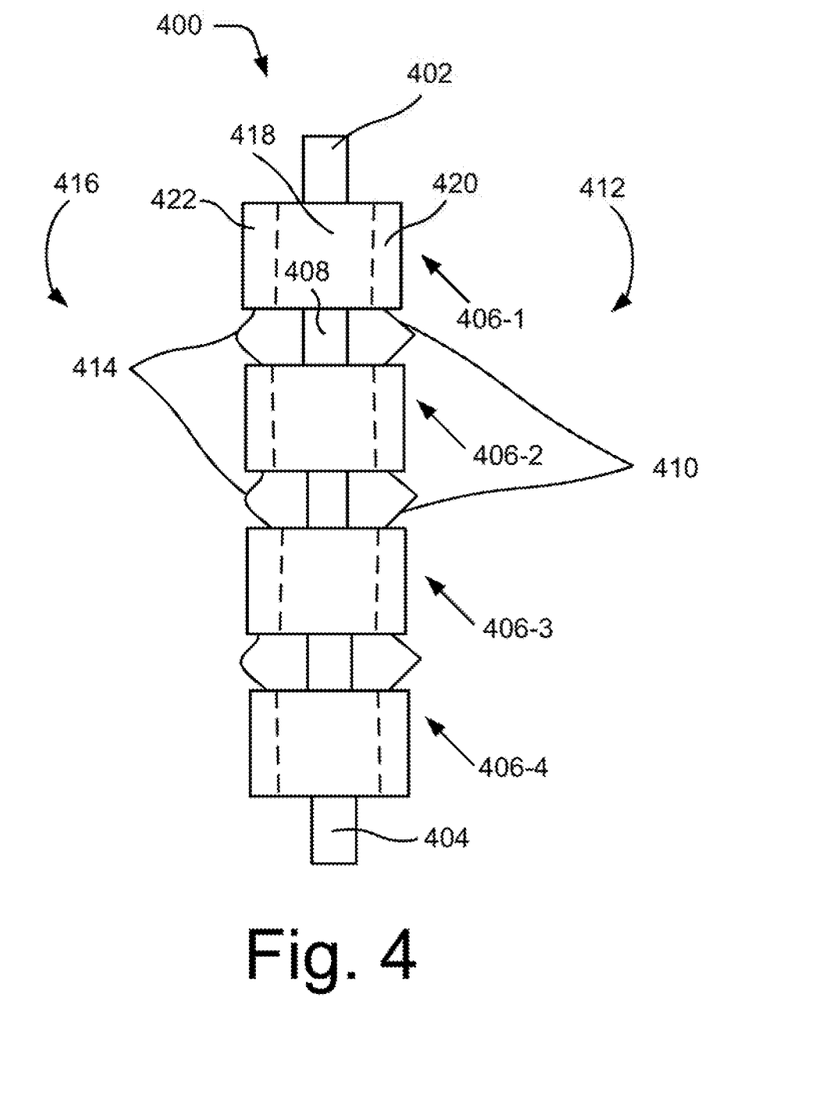
FIG. 4 illustrates a schematic representation of a hinge assembly, in accordance with an example implementation of the present subject matter.

FIG. 4 illustrates a schematic representation of a hinge assembly 400, in accordance with an example implementation of the present subject matter. In an example implementation, the hinge assembly 400 may couple a base unit of an electronic device (not shown in FIG. 4) to a display unit of the electronic device (not shown in FIG. 4).

The hinge assembly 400 has a first end 402 and a second end 404. In an example implementation, the first end 402 may be coupled to the base unit and the second end 404 may be coupled to the display unit. The hinge assembly 400 includes a plurality of hinge elements 406-1, 406-2, 406-3, and 406-4, also referred to as the hinge elements 406, between the first end 402 and the second end 404. Although in FIG. 4 four hinge elements are shown, in an example implementation there can be more than four or less than four hinge elements.

The hinge elements 406 are interconnected to move the hinge assembly 400 between a folded position and an unfolded position. The hinge elements 406 are interconnected through flanges 408 which may pass within a groove (not shown) of an adjacent hinge element. In an example implementation, the hinge elements 406 are identical to the first and second hinge elements 202 and 204 of the hinge assembly 200 as illustrated though FIGS. 2a to 2c.

The hinge assembly 400 includes a first set of elastic members 410. Each of the first set of elastic members are disposed between adjacent hinge elements, of the plurality of hinge elements 406, at a first side 412 thereof. The hinge assembly 400 further includes a second set of elastic members 414. Each of the second set of elastic members 414 are disposed between the adjacent hinge elements, of the plurality of hinge elements 406, at a second side 416 thereof. As can be seen from FIG. 4, the first side 412 is opposite to the second side 416. In an example implementation, each of the first set of elastic members 410 may be identical to the first elastic member 216 as depicted in FIG. 2b and each of second set of elastic members 412 may be identical to the second elastic member 218 as depicted in FIG. 2c.

In an example implementation, the hinge elements 406 operate in a similar manner as described with reference to the first and second hinge elements 202 and 204 in conjunction with FIGS. 3a to 3d. The first set of elastic members 410 and the second set of elastic members 414 gets characteristically compressed/decompressed and stretched/destretched depending on the direction of movement of the hinge assembly 400 thereby providing stability to the hinge assembly 400.

Each of the hinge elements 406 includes a central member 418, a first side segment 420 mounted on the central member 418, and a second side segment 422 mounted on the central member 418. Although in FIG. 4, the central member, the first side segment, and the second side segment is referenced with respect to the hinge element 406-1; however, each of the hinge elements 406-2 to 406-4 also have their respective central member, first side segment, and second side segment. In an example implementation, the central member 418 is identical to the central members 206-1 and 206-2 as depicted in FIG. 2a. In an example implementation, the first side segment 420 may be identical to the first side segments 208-1 and 208-2, as illustrated through FIG. 2b and the second side segment 422 may be identical to the second side segments 310-1 and 310-2, as illustrated through FIG. 2c. In an example implementation, the first side segments of each of the hinge elements 406 include all the features and configuration of the first side segments 208-1 and 208-2; and the second side segments of each of the hinge elements 406 include all the features and configuration of the second side segments 210-1 and 210-2

As shown in FIG. 4, a respective elastic member of the first set 410 is disposed between first side segments of the adjacent hinge elements and a respective elastic member of the second set 414 is disposed between second side segments of the adjacent hinge elements.

Figure 5:
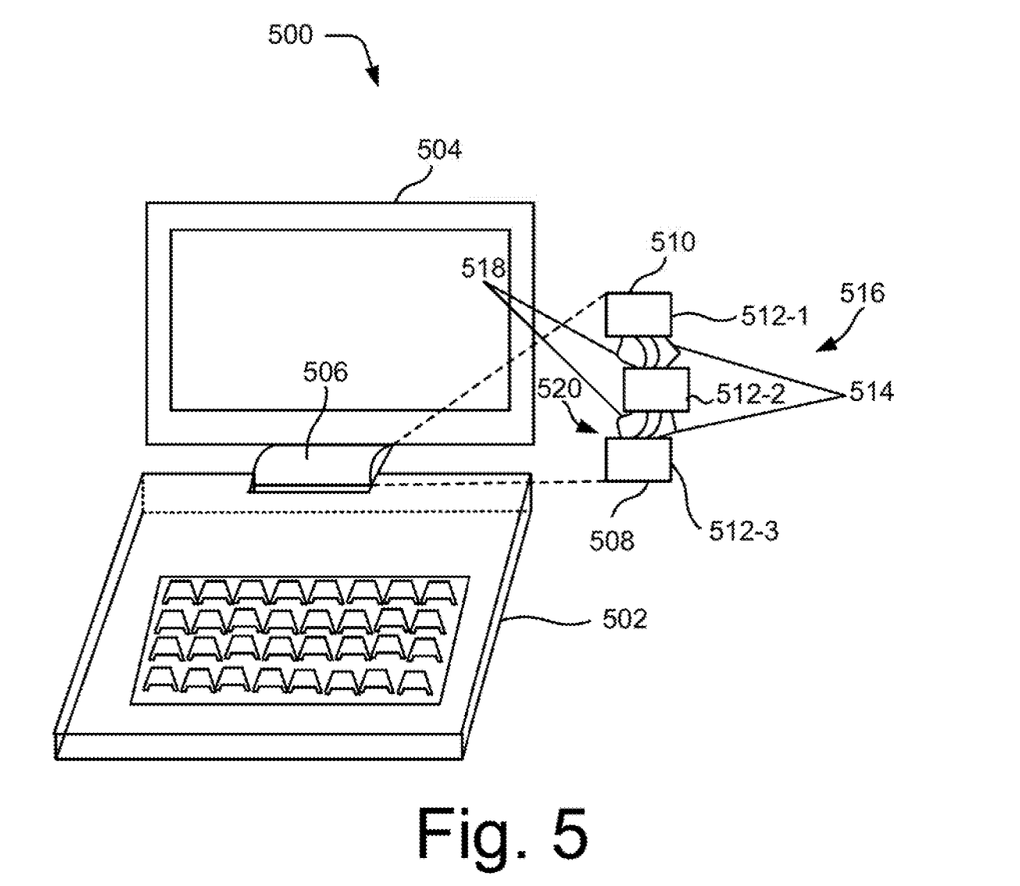
FIG. 5 illustrates a schematic representation of an electronic device, in accordance with an example implementation of the present subject matter.

FIG. 5 illustrates a schematic representation of an electronic device 500, in accordance with an example implementation of the present subject matter. The electronic device 500 includes a base unit 502 and a display unit 504 coupled to the base unit 502 through a hinge assembly 506. In an example implementation, the hinge assembly 506 may be positioned within a hinge cap that covers the hinge assembly 506. In an example implementation, the base unit 502 and the display unit 504 may be coupled through the hinge assemblies 100 or 200, illustrated earlier.

The hinge assembly 506 has a first end 508 coupled to the base unit 502 and a second end 510 coupled to the display unit 504. In an example implementation, the hinge assembly 500 may be moved between a folded position and an unfolded position. At the folded position, an angle between the base unit 502 and the display unit 504 is 0 degree and at the unfolded position an angle between the base unit 502 and the display unit 504 is 180 degrees.

The hinge assembly 506 includes a plurality of interconnected hinge elements, 512-1, 512-2, and 512-3, also referred as hinge elements 512, between the first end 508 and the second end 510. Although in FIG. 5 three hinge elements are shown, in an example implementation there can be more than three or less than three hinge elements.

The hinge assembly 506 further includes a first set of elastic members 514. Each elastic member of the first set is disposed between adjacent hinge elements, of the hinge elements 512, at a first side 516 thereof. In an example implementation, the first set of elastic members 514 is decompressed, when the hinge assembly is moved from the unfolded position to the folded position; and the first set of elastic members 514 is compressed when the hinge assembly 506 is moved from the folded position to the unfolded position. In an example implementation, the first set of elastic members 514 may have features and configuration similar to the first elastic member 216 of the hinge assembly 200.

The hinge assembly 506 further includes a second set of elastic members 518. Each elastic member of the second set is disposed between adjacent hinge elements, of the hinge elements 512, at a second side 520 thereof. In an example implementation, the second set of elastic members 518 is stretched, when the hinge assembly 506 is moved from the unfolded position to the folded position; and the second set of elastic members 518 is destretched, when the hinge assembly 506 is moved from the folded position to the unfolded position. In an example implementation, the second set of elastic members 518 may have features and configuration similar to the second elastic member 218 of the hinge assembly 200.

Although implementations of present subject matter have been described in language specific to structural features and/or methods, it is to be noted that the present subject matter is not necessarily limited to the specific features or methods described. Rather, the specific features and methods are disclosed and explained in the context of a few implementations for the present subject matter.

We claim:

1. A hinge assembly comprising:
a first hinge element;
a second hinge element interconnected with the first hinge element to move the hinge assembly between a folded position and an unfolded position, a slot formed between the first hinge element and second hinge element;

a first elastic member disposed between the first hinge element and the second hinge element at a first side thereof, the first elastic member being disposed in the slot; and a second elastic member disposed between the first hinge element and the second hinge element at a second side thereof;

wherein the first elastic member is decompressed as the width of the slot is increased and the second elastic member is stretched, when the hinge assembly is moved from the unfolded position towards the folded position; and wherein the first elastic member is compressed as a width of the slot is reduced and the second elastic member is destretched, when the hinge assembly is moved from the folded position towards the unfolded position.

2. The hinge assembly as claimed in claim 1, wherein each of the first hinge element and the second hinge element comprises:
   a central member;
   a first side segment mounted on the central member, wherein the first elastic member is disposed between the first side segment of the first hinge element and the first side segment of the second hinge element; and
   a second side segment mounted on the central member, wherein the second elastic member is disposed between the second side segment of the first hinge element and the second side segment of the second hinge element.

3. The hinge assembly as claimed in claim 2, wherein the slot is formed between the first side segment of the first hinge element and the first side segment of the second hinge element.

4. The hinge assembly as claimed in claim 2, further comprising:
   a first strut formed on the second side segment of the first hinge element, an end of the second elastic member being attached to the first strut; and
   a second strut formed on the second side segment of the second hinge element, other end of the second elastic member being attached to the second strut;
   wherein the second elastic member is stretched by movement of the first strut away from the second strut when the hinge assembly is moved from the unfolded position towards the folded position; and
   wherein the second elastic member is destretched by movement of the first strut towards the second strut when the hinge assembly is moved from the unfolded position towards the folded position.

5. The hinge assembly as claimed in claim 1, wherein the first elastic member is at a fully biased compressed state when the hinge assembly is at the unfolded position and at a decompressed neutral state when the hinge assembly is at the folded position.

6. The hinge assembly as claimed in claim 1, wherein the second elastic member is at a destretched neutral state when the hinge assembly is at the unfolded position and at a fully biased stretched state when the hinge assembly is at the folded position.

7. A hinge assembly to couple a base unit of an electronic device to a display unit of the electronic device, the hinge assembly comprising:
   a plurality of hinge elements interconnected to move the hinge assembly between a folded position and an unfolded position;
   a first set of elastic members, each elastic member of the first set being disposed between adjacent hinge elements, of the plurality of hinge elements, at a first side thereof, a respective elastic member of the first set being disposed in a slot formed between the adjacent hinge elements; and
   a second set of elastic members, each elastic member of the second set being disposed between the adjacent hinge elements, at a second side thereof;
   wherein the first set of elastic members is decompressed, the respective elastic member of the first set is decompressed as the width of the slot is increased, and the second set of elastic members is stretched, when the hinge assembly is moved from the unfolded position to the folded position; and
   wherein the first set of elastic members is compressed, the respective elastic member of the first set is compressed as a width of the slot is reduced, and the second set of elastic members is destretched, when the hinge assembly is moved from the folded position to the unfolded position.

8. The hinge assembly as claimed in claim 7, wherein each of the plurality of hinge elements comprises:
   a central member;
   a first side segment mounted on the central member, wherein the respective elastic member of the first set is disposed between first side segments of the adjacent hinge elements; and
   a second side segment mounted on the central member, wherein a respective elastic member of the second set is disposed between second side segments of the adjacent hinge elements.

9. The hinge assembly as claimed in claim 8, wherein the slot is formed between the first side segments of the adjacent hinge elements.

10. The hinge assembly as claimed in claim 8, further comprising:
    a pair of struts, each strut of the pair formed on the second side segments of the adjacent hinge elements, the respective elastic member of the second set being coupled to the pair of struts;
    wherein the respective elastic member of the second set is stretched by movement of the pair of struts away from each other when the hinge assembly is moved from the unfolded position towards the folded position; and
    wherein the respective elastic member of the second set is destretched by movement of the pair of struts towards each other when the hinge assembly is moved from the unfolded position towards the folded position.

11. The hinge assembly as claimed in claim 7, wherein each of the first set of elastic members is at a fully biased compressed state when the hinge assembly is at the unfolded position and at a decompressed neutral state when the hinge assembly is at the folded position.

12. The hinge assembly as claimed in claim 7, wherein each of the second set of elastic members is at a destretched neutral state when the hinge assembly is at the unfolded position and at a fully biased stretched state when the hinge assembly is at the folded position.

13. An electronic device comprising:
    a base unit; and
    a display unit coupled to the base unit through a hinge assembly, wherein the hinge assembly is movable between a folded position and an unfolded position, the hinge assembly comprising:
    a first end coupled to the base unit;
    a second end coupled to the display unit;
    a plurality of interconnected hinge elements between the first end and the second end;

a first set of elastic members, each elastic member of the first set being disposed between adjacent hinge elements, of the plurality of hinge elements, at a first side thereof, a respective elastic member of the first set being disposed in a slot formed between the adjacent hinge elements; and a second set of elastic members, each elastic member of the second set being disposed between the adjacent hinge elements, at a second side thereof;

wherein the first set of elastic members is decompressed, the respective elastic member of the first set is decompressed as the width of the slot is increased, and the second set of elastic members is stretched, when the hinge assembly is moved from the unfolded position to the folded position; and wherein the first set of elastic members is compressed, the respective elastic member of the first set is compressed as a width of the slot is reduced, and the second set of elastic members is destretched, when the hinge assembly is moved from the folded position to the unfolded position.

14. The electronic device as claimed in claim 13, wherein each of the plurality of interconnected hinge elements comprises:

a central member;

a first side segment mounted on the central member, wherein the respective elastic member of the first set is disposed between first side segments of the adjacent hinge elements; and a second side segment mounted on the central member, wherein a respective elastic member of the second set is disposed between second side segments of the adjacent hinge elements.

15. The electronic device as claimed in claim 13, wherein each of the first set of elastic members is at a fully biased compressed state when the hinge assembly is at the unfolded position and at a decompressed neutral state when the hinge assembly is at the folded position.

16. The electronic device as claimed in claim 13, wherein each of the second set of elastic members is at a destretched neutral state when the hinge assembly is at the unfolded position and at a fully biased stretched state when the hinge assembly is at the folded position.

* * * * *